United States Patent
Hembree et al.

(10) Patent No.: US 7,709,279 B2
(45) Date of Patent: May 4, 2010

(54) METHODS FOR TESTING SEMICONDUCTOR DEVICES METHODS FOR PROTECTING THE SAME FROM ELECTROSTATIC DISCHARGE EVENTS DURING TESTING, AND METHODS FOR FABRICATING INSERTS FOR USE IN TESTING SEMICONDUCTOR DEVICES

(75) Inventors: David R. Hembree, Boise, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/827,806

(22) Filed: Apr. 20, 2004

(65) Prior Publication Data
US 2004/0195584 A1 Oct. 7, 2004

Related U.S. Application Data

(62) Division of application No. 10/230,836, filed on Aug. 29, 2002.

(51) Int. Cl.
*H01L 21/66* (2006.01)
*H01L 23/58* (2006.01)

(52) U.S. Cl. .............................. 438/18; 438/11; 438/14; 438/17; 257/48; 257/355

(58) Field of Classification Search ......... 257/355–363, 257/48; 438/11, 14–18
See application file for complete search history.

(56) References Cited

U.S. PATENT DOCUMENTS

| | | | |
|---|---|---|---|
| 4,127,888 A | 11/1978 | Epstein | |
| 4,736,271 A * | 4/1988 | Mack et al. | 361/56 |
| 5,315,252 A | 5/1994 | Puetz et al. | |
| 5,341,267 A | 8/1994 | Whitten et al. | |
| 5,361,185 A | 11/1994 | Yu | |
| 5,465,186 A | 11/1995 | Bajorek et al. | |
| 5,483,741 A | 1/1996 | Akram et al. | |
| 5,500,546 A | 3/1996 | Marum et al. | |
| 5,663,655 A | 9/1997 | Johnston et al. | |
| 5,721,496 A | 2/1998 | Farnworth et al. | |
| 5,814,865 A | 9/1998 | Duvvury et al. | |
| 6,016,060 A | 1/2000 | Akram et al. | |
| 6,018,249 A | 1/2000 | Akram et al. | |
| 6,040,733 A | 3/2000 | Casper et al. | |
| 6,069,782 A | 5/2000 | Lien et al. | |
| 6,099,597 A | 8/2000 | Yap et al. | |
| 6,118,155 A | 9/2000 | Voldman | |
| 6,136,137 A | 10/2000 | Farnworth et al. | |
| 6,175,245 B1 * | 1/2001 | Bowe et al. | 324/765 |

* cited by examiner

*Primary Examiner*—Ori Nadav
(74) *Attorney, Agent, or Firm*—TraskBritt

(57) ABSTRACT

An apparatus and method for providing external electrostatic discharge (ESD) protection to a semiconductor device, which may or may not include its own ESD protection, are provided. An ESD structure may be associated with each interconnect, either individually or shared between two or more interconnects. Each interconnect includes a contact tip for establishing a temporary electrical connection with a bond pad of the semiconductor device and a contact pad for electrically interfacing the bond pad with external burn-in and/or test equipment. The ESD structure may be implemented, for example, as a fusible element or a shunting element, such as a pair of diodes, a diode-resistor network, or a pair of transistors. The interconnect may be employed as part of an insert including a plurality of interconnects that provides ESD protection to a plurality of integrated circuits of at least one semiconductor device.

7 Claims, 7 Drawing Sheets

US 7,709,279 B2

METHODS FOR TESTING SEMICONDUCTOR DEVICES METHODS FOR PROTECTING THE SAME FROM ELECTROSTATIC DISCHARGE EVENTS DURING TESTING, AND METHODS FOR FABRICATING INSERTS FOR USE IN TESTING SEMICONDUCTOR DEVICES

CROSS-REFERENCE TO RELATED APPLICATION

This application is a divisional of application Ser. No. 10/230,836, filed Aug. 29, 2002, pending.

BACKGROUND OF THE INVENTION

1. Field of the Invention

The present invention relates to the manufacture of semiconductor devices, such as bare dice or dice contained on a wafer. More specifically, the present invention relates to an improved apparatus and method for providing electrostatic discharge protection to a test fixture which is electrically connected to a semiconductor device during burn-in and/or testing.

2. Background of Related Art

It is well known that electrostatic discharge (ESD) can damage semiconductor devices. Thus, ESD protection circuits are typically integrated into a semiconductor die to protect the input and output circuitry. Exemplary ESD protection circuitry located between a bonding pad and internal circuitry of a semiconductor device are disclosed in U.S. Pat. No. 5,500,546, issued Mar. 19, 1996, entitled "ESD Protection Circuits Using Zener Diodes," to Marum et al. and in U.S. Pat. No. 6,040,733, issued Mar. 21, 2000, entitled "Two-stage Fusible Electrostatic Discharge Protection Circuit," to Casper et al.

In order to conserve the amount of surface area, or "real estate," consumed on a die, ESD circuitry may not always be included as part of the die. In such a case, ESD protection is typically included in the packaging for the die or in higher-level packaging, as when the die is used to construct multi-chip modules or other semiconductor die-based devices.

Bare (i.e., unpackaged) dice maybe burned-in and tested during the manufacturing process to ensure that each die is a known good die (KGD). For burn-in and testing, a bare die is placed in a carrier which provides a temporary electrical connection with the bond pads of the die for interconnection with external test circuitry. Akram et al., in U.S. Pat. No. 6,018,249, issued Jan. 25, 2000 (hereinafter "Akram '249"), which is assigned to the assignee of the present invention and hereby incorporated herein in its entirety by this reference, discloses a test system for testing semiconductor components which includes an interconnect for making temporary electrical connection with the semiconductor components.

Further, Akram et al., in U.S. Pat. No. 6,016,060, issued Jan. 18, 2000 (hereinafter "Akram '060"), which is assigned to the assignee of the present invention and hereby incorporated herein in its entirety by this reference, discloses an interconnect for temporarily establishing electrical communication with semiconductor components having contact bumps. FIG. 1 shows one embodiment of test fixture disclosed in Akram '060. As shown in FIG. 1, that test fixture, which is referred to in Akram '060 as "interconnect 20," includes a substrate 24 and a plurality of contact members 22 arranged on substrate 24 so as to contact and electrically engage the bond pads of a semiconductor device (not shown) to be burned-in or tested. Each contact member 22 is electrically connected to a corresponding contact pad 31 of the test fixture (interconnect 20) through a conductor 30. The contact pads 31 are configured to provide an electrical connection from external test circuitry (not shown) to the bond pads of the semiconductor device.

Handling of a bare semiconductor device, or die, without internal ESD protection circuitry during burn-in and test processes can destroy the semiconductor device. To protect semiconductor devices from ESD damage, state-of-the-art test carriers, such as those disclosed in U.S. Pat. No. 6,136,137 to Farnworth et al. and U.S. Pat. No. 6,099,597 to Yap et al., include conductive metal surfaces that conduct built-up electrostatic charges away from carrier surfaces which touch, or are in close proximity to, the bare semiconductor devices.

Test fixtures that include ESD protection circuitry placed thereon so as to protect the input and output bond pads of a bare semiconductor device without its own internal ESD protection circuitry are not known in the art.

SUMMARY OF THE INVENTION

The present invention includes apparatus and methods for providing external electrostatic discharge (ESD) protection to the circuitry of a semiconductor device during burn-in and testing thereof. The semiconductor device may include its own ESD protective elements or may lack such elements. When external ESD structures that incorporate teachings of the present invention are used with semiconductor devices that include ESD protective elements, the external ESD structures may shield or buffer the ESD protective elements of the semiconductor device from ESD events that may occur prior to final packaging or normal operational use of the semiconductor device, such as during testing thereof. Such protection may be provided by "sizing" the external ESD structures to shunt excess voltage at a lower threshold voltage than the threshold voltage for which the ESD protective elements of the semiconductor device are configured.

An exemplary embodiment of an apparatus incorporating teachings of the present invention comprises a test fixture, which is referred to herein as an "insert" and as a "test interconnect" or, for simplicity, as an "interconnect." The insert includes at least one, and normally a plurality of, interconnect circuits. The insert includes structures for providing protection against ESD damage, hereinafter referred to for simplicity as "ESD structures," along each interconnect circuit thereof, between a contact tip, or contact element, and corresponding test pad of the interconnect circuit. The contact tips of the insert are configured to temporarily contact and establish electrical connection with corresponding bond pads of a semiconductor device to be burned-in or tested. The test pads are configured to communicate with corresponding circuits of a burn-in or test apparatus.

Each ESD structure is configured to substantially eliminate voltage "spikes" associated with ESD events. The ESD structures may be implemented in a variety of ways including, but not limited to, as a voltage shunt, such as a diode-resistor network or group of transistors, as a fusible element, or otherwise.

Another embodiment of the present invention comprises an insert comprising a plurality of interconnect circuits and an ESD structure that is common to at least some of the plurality of interconnect circuits.

The method of the present invention may be performed with an insert configured to provide ESD protection to a semiconductor device while in temporary contact with a bond pad of the semiconductor device. As used herein, the term "bond pad" may include a bond pad or other contact that is ultimately in communication with a bond pad or other conductive path, such as a trace of a redistribution layer (RDL) leading to integrated circuitry, of a semiconductor device, such as a lead, solder ball, or other conductive element of a packaged semiconductor device. Accordingly, the method may comprise burning-in or testing a variety of types of semiconductor devices, including, without limitation, bare and substantially bare semiconductor devices, chip-scale packages (CSPs), and packaged semiconductor devices (e.g., leaded semiconductor devices and semiconductor devices which include discrete conductive elements protruding from a major surface thereof, such as in a grid array or otherwise).

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate exemplary embodiments of various aspects of the present invention and in which like references refer to like parts in different views or embodiments.

DETAILED DESCRIPTION OF THE INVENTION

Figure 1:
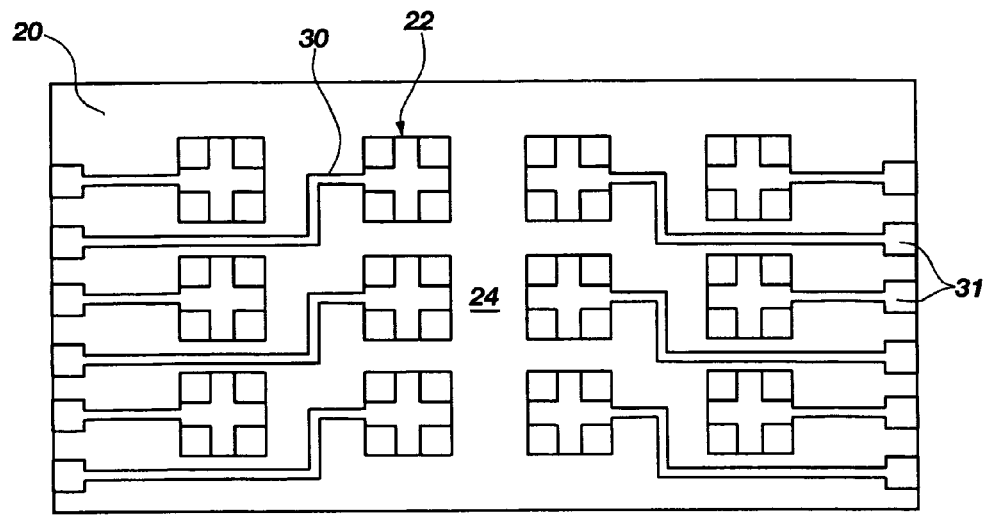
FIG. 1 is a schematic plan view of a prior art insert including a plurality of interconnect circuits.
Figure 2:
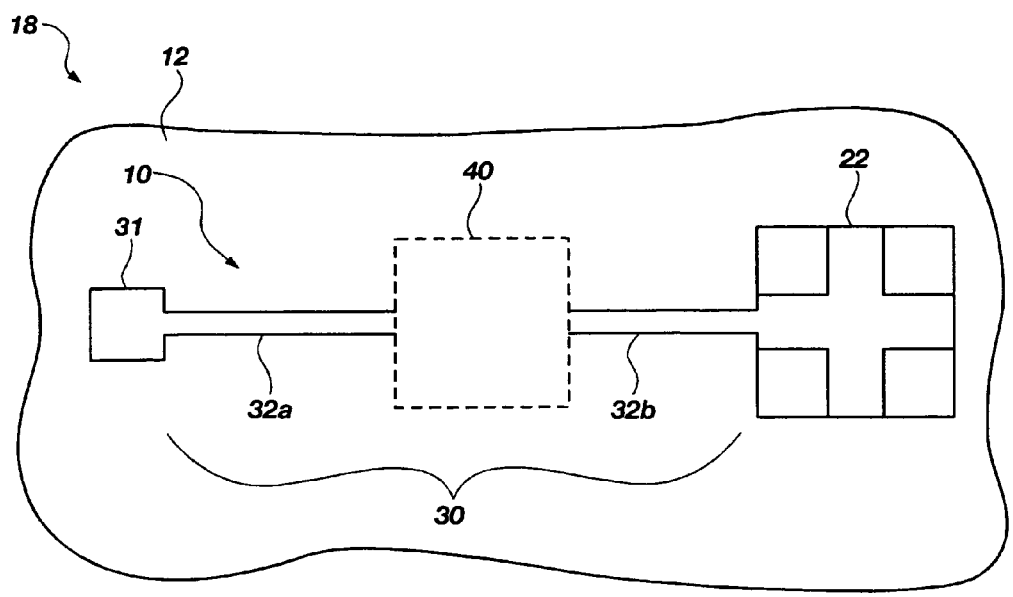
FIG. 2 is a combined block diagram/enlarged schematic representation of an interconnect circuit of an insert which includes electrostatic discharge protection circuitry, or an ESD structure, in accordance with the present invention.
Figure 2A:
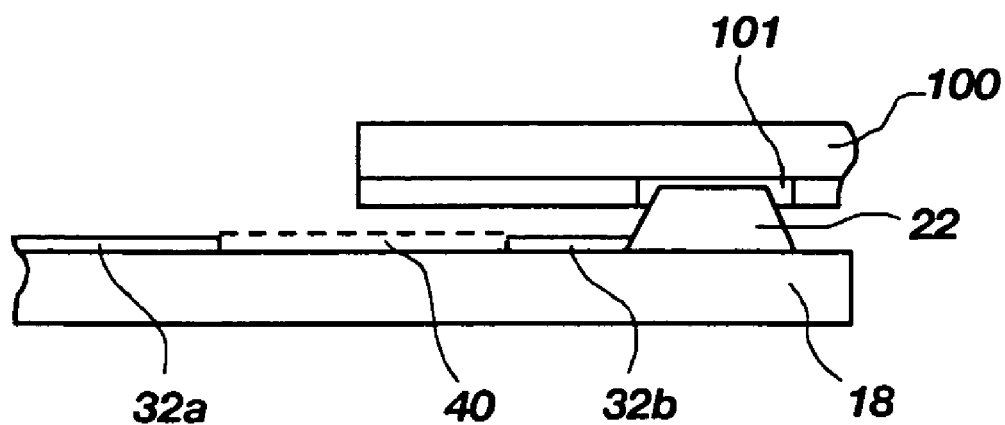
FIG. 2A is a cross-essential schematic representation of the section of the insert shown in FIG. 2 assembled with a semiconductor device under test.

With reference to FIG. 2, a combined block diagram/enlarged schematic representation of an insert 18 according to the present invention with electrostatic discharge protection circuitry (ESD structures 40) is shown. Insert 18 includes each of the elements described in Akram '060, the disclosure of which has been incorporated by reference, including a substrate 12, such as a bulk semiconductor substrate (e.g., a full or partial wafer of silicon, gallium arsenide, indium phosphide, etc.) on which is formed a plurality of interconnect circuits 10. Each interconnect circuit 10 includes a contact member or tip 22, a conductor 30 that extends laterally from its corresponding contact tip 22, and a contact pad 31, or test pad, at an opposite end of conductor 30 from contact tip 22. Each contact tip 22 is configured to engage and establish electrical contact with a bond pad 101 of a semiconductor device 100, as shown in FIG. 2A (see also FIGS. 4, 5A, and 5B). Each contact pad 31 is configured to provide an electrical connection from external test circuitry (not shown) to the bond pad 101 of semiconductor device 100 through its corresponding conductor 30 and contact tip 22.

In addition, each interconnect circuit 10 of an insert 18 that incorporates teachings of the present invention includes an ESD structure 40. As shown, ESD structure 40 is positioned at an intermediate position along the length of a conductor 30. As such, conductor 30 may comprise a conductive element 32a that extends between and electrically connects contact pad 31 (see also FIG. 4) and ESD structure 40 to one another and another conductive element 32b that extends between and electrically connects ESD structure 40 and contact tip 22 (see also FIGS. 4, 5A, and 5B) to each other. Conductive elements 32a and 32b may be configured so as to aid in positioning all of the contact pads 31 and contact tips 22 of insert 18 at locations that respectively correspond to the arrangements of electrical connectors of external test equipment (not shown) and bond pads of a semiconductor device (not shown) so as to make sufficient contact therewith. However, the ESD structure 40 may be connected directly to contact pad 31 without the use of conductive element 32a or to contact tip 22 without the use of conductive element 32b. The ESD structure 40 may also be connected directly between the contact pad 31 and the contact tip 22 without the use of either conductive element 32a or 32b, or incorporated within the structure of either contact pad 31 or contact tip 22.

Figure 3:
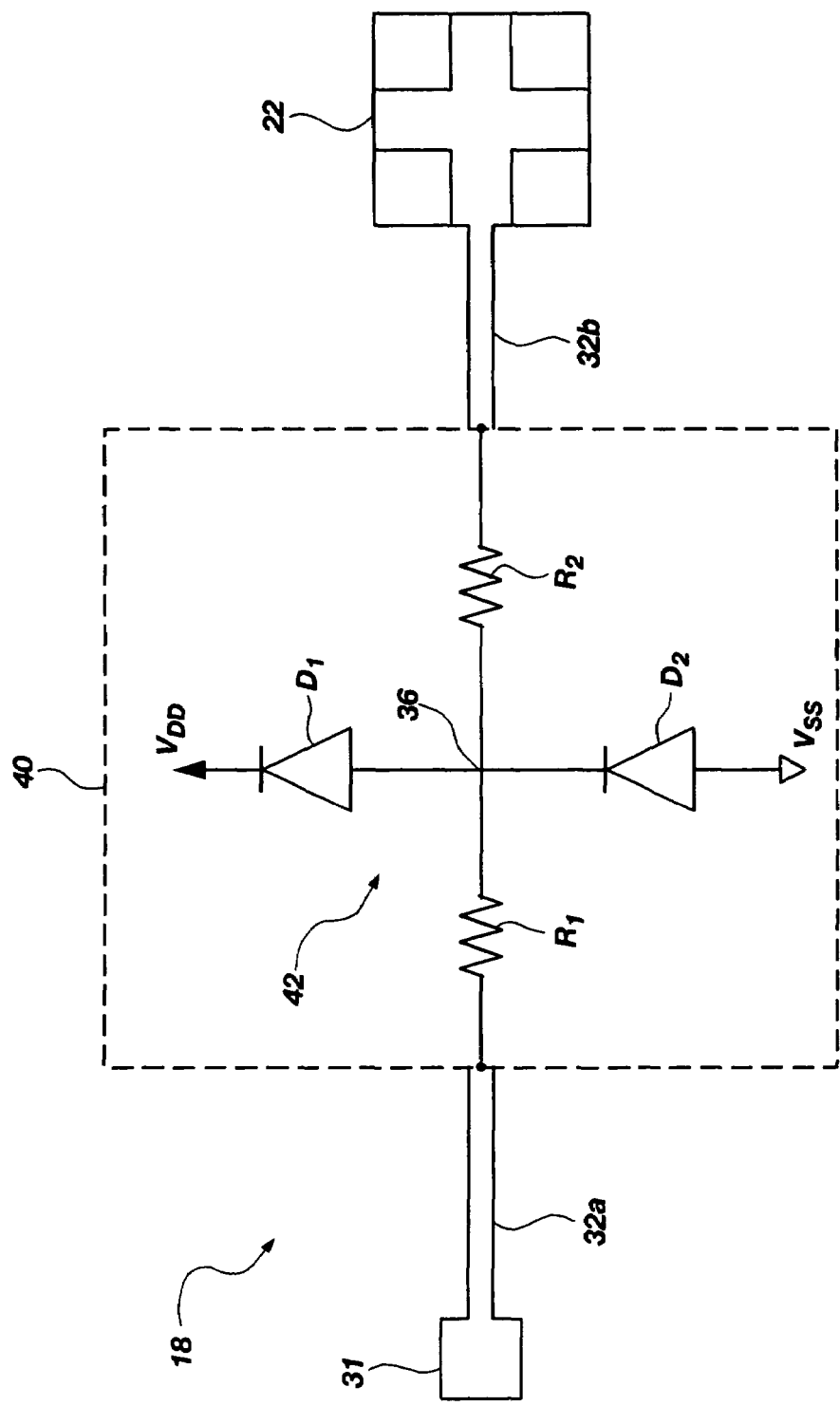
FIG. 3 is a combined block diagram/enlarged schematic representation of the interconnect circuit of FIG. 2, illustrating an example of an ESD structure, which comprises a diode-resistor network.

FIG. 3 depicts a combined block diagram/enlarged schematic representation of the insert 18 of FIG. 2 illustrating the ESD structure 40 as a diode-resistor network 42, which shunts excess voltage from interconnect circuit 10 (FIG. 2). Diode-resistor network 42 includes a resistive element $R_1$ which is electrically connected to the contact pad 31 through conductive element 32a, a resistive element $R_2$ electrically connected to resistive element $R_1$ at node 36 and to contact tip 22 through conductive element 32b, a diode $D_1$ electrically connected between a $V_{DD}$ voltage (i.e., power) potential and node 36, and a diode $D_2$ electrically connected between a $V_{SS}$ voltage (i.e., ground) potential and node 36. Resistive elements $R_1$ and $R_2$ limit the peak current which flows from contact pad 31 or contact member 22 through diodes $D_1$ and $D_2$ during an ESD event. Diode $D_1$ may be configured to turn on when the voltage potential at node 36 is greater than or equal to $V_{DD}$+0.7 Volts and diode $D_2$ may be configured to turn on when the voltage potential at node 36 is less than or equal to $V_{SS}$−0.7 Volts, thus "clamping" the voltage potential at node 36 to levels which will not damage the semiconductor device. One skilled in the art will recognize that the $V_{DD}$ voltage potential and the $V_{SS}$ voltage potential may be the same voltage potentials used to power the semiconductor device electrically connected to contact member 22 during burn-in and testing.

Figure 4:
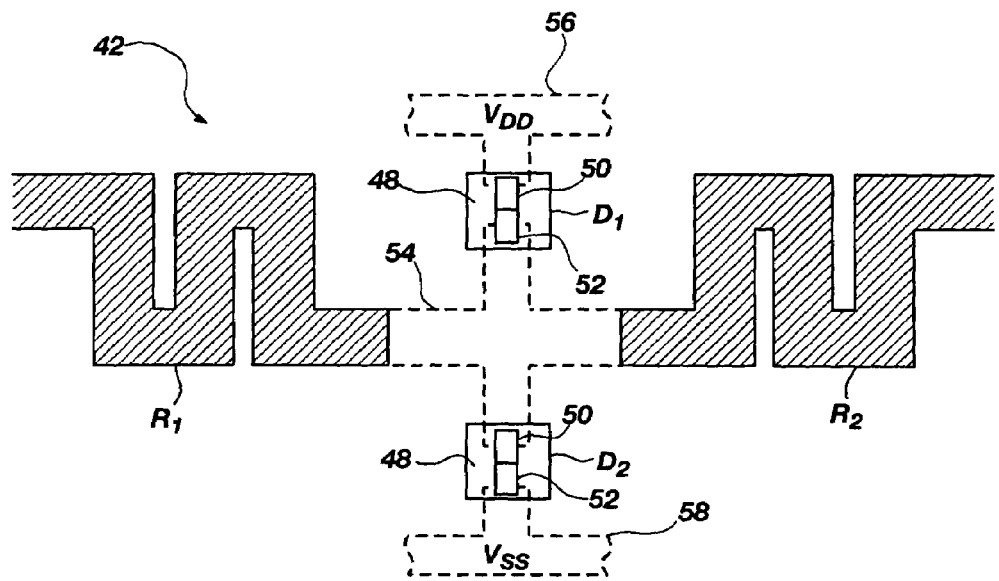
FIG. 4 is a top plan layout representation of the diode-resistor network of FIG. 3, of which the diodes comprise a voltage shunting element.

FIG. 4 is a top plan layout representation of the diode-resistor network 42 of FIG. 3 as implemented on a silicon substrate 12 (not shown). Resistive elements $R_1$ and $R_2$ may each be formed as a slab of polysilicon with known resistivity. As shown in FIG. 4, resistive elements $R_1$ and $R_2$ may be shaped so as to increase the length and, hence, the total electrical resistance of resistive elements $R_1$ and $R_2$. Conductive connector 54 provides an electrical connection between resistive elements $R_1$ and $R_2$, as well as between diodes $D_1$ and $D_2$ at a point corresponding to node 36 of FIG. 3.

Figure 5A:
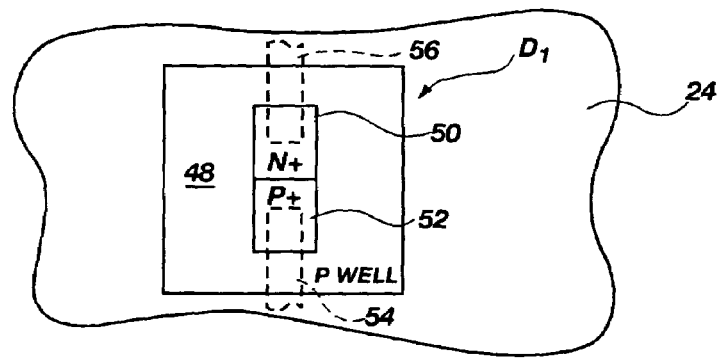
FIG. 5A is an enlarged top plan layout of diode $D_1$ of FIG. 4.
Figure 5B:
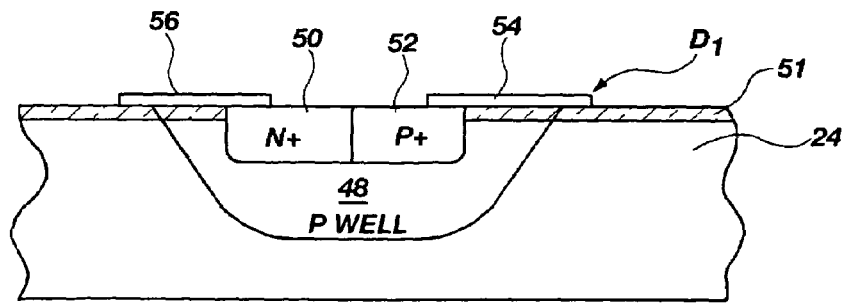
FIG. 5B is a cross-sectional representation of diode $D_1$ of FIG. 5A.

For clarity, FIGS. 5A and 5B show an enlarged layout of diode $D_1$. While the enlarged layout is only shown for diode $D_1$, it should be noted that the layout of diode $D_2$ may be substantially identical to that of diode $D_1$. FIG. 5A shows a top plan layout of diode $D_1$ while FIG. 5B shows a corresponding cross-sectional plan layout of diode $D_1$ of FIG. 5A. Diode $D_1$ includes a P-type silicon region 48 or "P well" formed in a silicon substrate 24. An N+ region 50 and a P+ region 52 are formed within the P well region 48 to form a "PN junction" typical of a diode. Thus, the N+ region 50 corresponds to a cathode and the P+ region 52 corresponds to an anode of diode $D_1$. As seen in FIG. 4, diode $D_1$ is electrically connected to conductive connector 54 through P+ region 52 and to a $V_{DD}$ bus 56 through N+ region 50. Conductive connector 54 and $V_{DD}$ bus 56 are electrically isolated from substrate 24 and the P well region 48 thereof by a dielectric layer 51 (e.g., a layer comprising silicon dioxide or another suitable dielectric material). Further, diode $D_2$ is electrically connected to conductive connector 54 through N+ region 50 and to a $V_{SS}$ bus 58 through P+ region 52.

Figure 6:
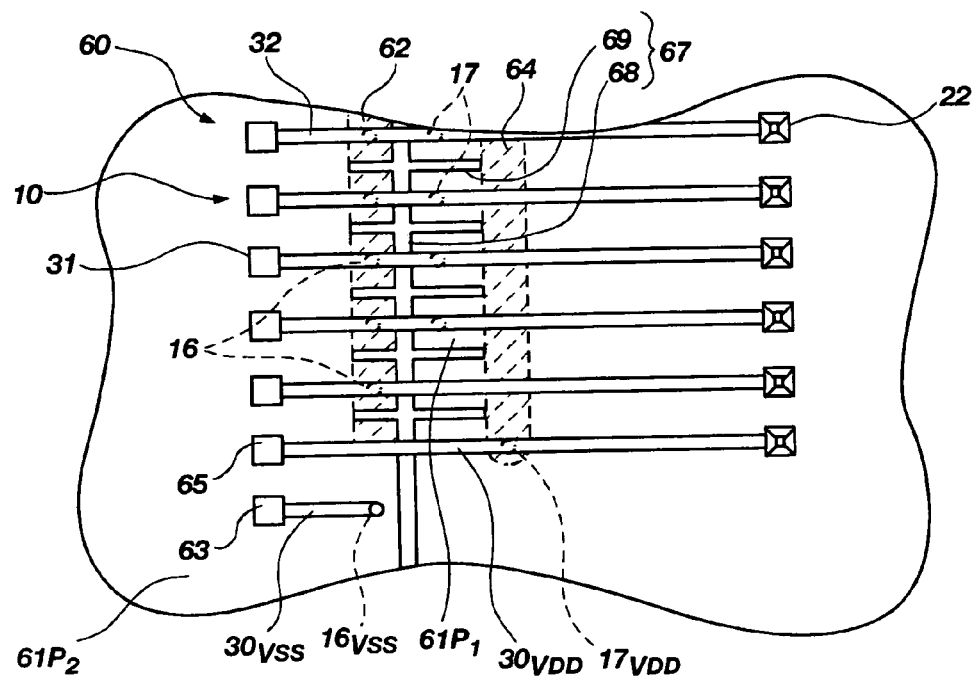
FIG. 6 is a top plan layout representation of a variation of a voltage shunting element that may be used as at least a part of the ESD structure of FIG. 2.
Figure 7:
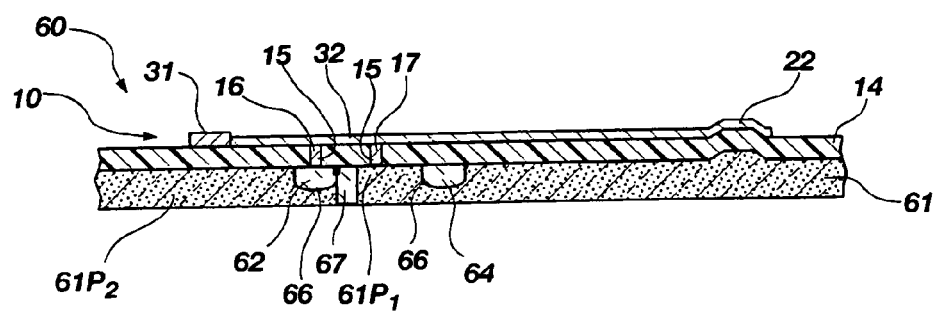
FIG. 7 is a cross-sectional representation of the voltage shunting element of FIG. 6, taken along line 7-7 thereof.

Another example of a voltage shunting element 60 that may be used as ESD structure 40 in interconnect circuit 10 of the insert 18 shown in FIG. 2 is depicted in FIGS. 6 and 7. As shown in FIGS. 6 and 7, voltage shunting element 60 comprises a pair of elongate but isolated spaced-apart n-wells 62 and 64 formed in a p-type substrate 12. N-well 62 communicates with the conductive element 32, while n-well 64 communicates with a $V_{DD}$ voltage potential. N-wells 62 and 64 are formed in a p-type material, such as substrate 12 or a layer of p-type material 61 formed over and electrically isolated from substrate 12.

An insulative, or dielectric, layer 14 is located over n-wells 62 and 64, as well as over the semiconductive material in which n-wells 62 and 64 are formed, to electrically isolate structures, such as conductive elements 32, contact pads 31, and contact tips 22, from n-wells 62 and 64 and the layer of semiconductive material in which they are formed. A center member 68 of a dielectric isolation structure 67, such as a trench isolation structure, extends downward into substrate 12 to electrically isolate n-wells 62 and the p-type material $61P_2$ in which n-wells 62 are formed from adjacent regions $61P_1$ of p-type material 61. Dielectric isolation structure 67 also includes laterally extending members 69 that electrically isolate the regions of n-wells 62 and regions $61P_1$ that correspond to a particular interconnect circuit 10 from the regions of n-wells 62 and regions $61P_1$ that correspond to an adjacent interconnect circuit 10 from one another and, thus, prevent electrical shorting between adjacent interconnect circuits 10. Electrically conductive vias 16 and 17 extend through the insulative layer 14 and electrically connect each conductive element 32 to a corresponding n-well 62 region and to a corresponding region $61P_1$ of p-type material 61 located between n-well 62 and n-well 64, respectively. Similar electrically conductive vias $16_{V_{SS}}$ are used to contact p-type material $61P_2$ of substrate 12 and conductive element $30_{V_{SS}}$ that extends over insulative layer 14 and to a ground pad 63 through which the $V_{SS}$ voltage potential is communicated. N-well 64 communicates with the $V_{DD}$ voltage potential by way of an electrically conductive via $17_{V_{DD}}$ that contacts n-well 64 and extends through insulative layer 14 to a conductive element $30_{V_{DD}}$ that extends over insulative layer 14 and to a power pad 65 through which the $V_{DD}$ voltage potential is communicated.

As such, in voltage shunting element 60, diode $D_1$ of the schematic shown in FIG. 3 is formed at the junction 66 between the region $61P_1$ of p-type material 61 and n-well 64. Diode $D_2$ of the schematic shown in FIG. 3 is present in voltage shunting element 60 at the junction 66 between n-well 62 and the p-type material $61P_2$ connected to $V_{SS}$ by electrically conductive via $16_{V_{SS}}$.

Substrate 12 may be patterned, as known in the art, to form contact tips 22. By way of example, contact tips 22 having the shapes of pillars or truncated pyramids may be formed from substrate 12 by known photomask and isotropic etch processes, such as those described in U.S. Pat. No. 5,483,741 to Akram et al., the disclosure of which is hereby incorporated herein in its entirety by this reference. When potassium hydroxide (KOH) is used as the anisotropic etchant, a silicon substrate 12 is etched at an angle of about 54°, with silicon located beneath inside corners being substantially protected from the etchant. Accordingly, an H-shaped mask may be used to pattern the silicon of substrate 12 to provide protrusions which could be used in the fabrication of contact tips 22 that have the shapes of truncated pyramids. A completed contact tip 22 having a truncated pyramid configuration and a top with dimensions of about 40 μm×40 μm would fit into a bond pad having dimensions of about 100 μm×100 μm.

Known processes may be used to fabricate each of the features of voltage shunting element 60. By way of example only, each n-well 62, 64 may be formed by masking a lightly doped p-type material 61 (e.g., silicon, polysilicon, etc.) and implanting or diffusing dopant (e.g., phosphorus or antimony) into regions of substrate 12 that are exposed through the mask (e.g., a photomask), as known in the art. Also, insulative layer 14 may be grown or deposited onto substrate 12 and the protrusions thereof that will subsequently form parts of contact tips 22 by known techniques appropriate for the type of insulative material desired (e.g., a silicon oxide, silicon nitride, silicon oxynitride, etc.). Apertures 15 may then be formed through insulative layer 14 at locations where electrically conductive vias 16, 17 are desired. Known mask and etch processes, which, of course, are suitable for removing the material of insulative layer 14, may be employed to form apertures 15. Next, a layer of conductive material, such as a metal (e.g., aluminum, copper, titanium, tungsten, etc.), metal alloy, or conductively doped (e.g., to have a p-type conductivity) polysilicon, may be formed over insulative layer 14 and within the apertures 15 that are formed through insulative layer 14.

The conductive material within apertures 15 forms electrically conductive vias 16, 17. One or more conductive elements 32 may be formed by patterning the layer of conductive material (e.g., aluminum, copper, titanium, tungsten, etc.), as known in the art, such as by suitable mask and etch processes. Each contact pad 31 and contact tip 22 may be formed simultaneously with or separately from the fabrication of each conductive element 32. By way of example only, a first conductive layer comprising titanium silicide ($TiSi_x$), which will prevent bond pads of a semiconductor device from fusing to contact tip 22, may be formed on insulative layer 14 and a second conductive layer comprising aluminum formed over the $TiSi_x$. These conductive layers may then be patterned to form the electrically conductive structures of an interconnect circuit 10.

Figure 8:
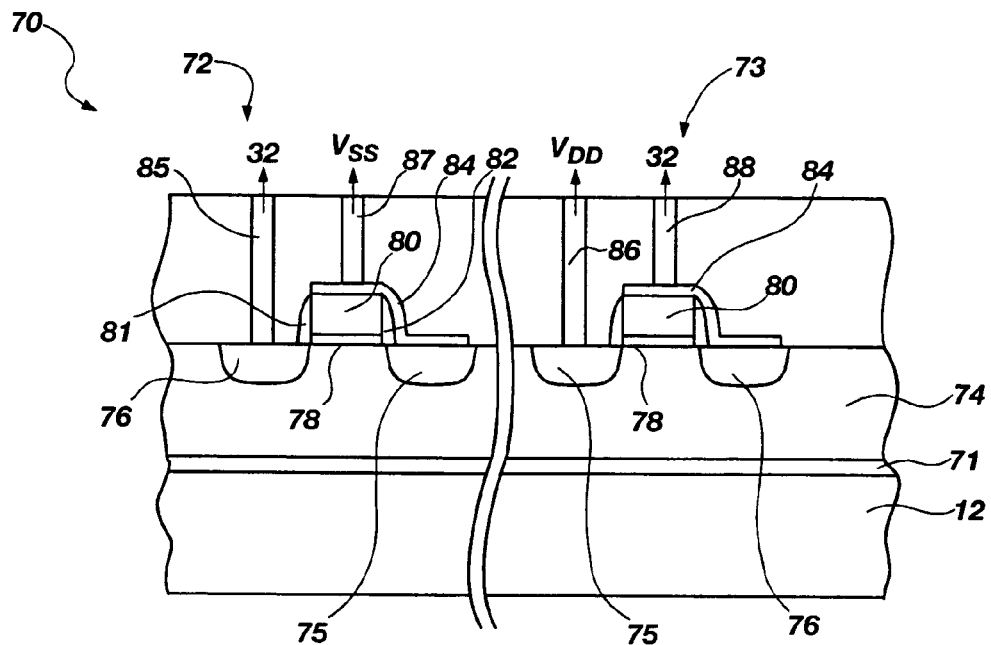
FIG. 8 is a cross-sectional representation of another variation of a voltage shunting element, which includes a pair of transistors, that may be used as at least a part of the ESD structure of FIG. 2.

Yet another exemplary embodiment of ESD structure 40 (FIG. 2) incorporating teachings of the present invention comprises a voltage shunting element 70 that includes a pair of transistors 72 and 73, as depicted in FIG. 8, both of which communicate with conductive element 32 of interconnect circuit 10 (FIG. 2). An insulative layer 71 electrically isolates each transistor 72, 73 from substrate 12 of insert 18 (FIG. 2) on which voltage shunting element 70 is being used. As shown, each transistor 72, 73 includes spaced-apart source and drain wells 75 and 76, respectively, formed in a semiconductive layer 74, such as a polysilicon layer, which has been formed on insulative layer 71. By way of example, wells 75 and 76 may comprise regions of semiconductive layer 74 that have been doped to have an n-type conductivity and the remainder of semiconductive layer 74 may comprise a p-type material. A gate dielectric 78 of each transistor 72, 73 is located on semiconductive layer 74, laterally between wells 75 and 76. A conductive element 80 of each transistor 72, 73 overlies gate dielectric 78. Conductive element 80 may be formed from any suitable, electrically conductive material, such as conductively doped polysilicon or a metal. Sidewall spacers 81 and 82 are positioned laterally adjacent to each side of conductive element 80.

Transistor 72, which communicates with $V_{DD}$, includes a conductive link 84 that extends between and provides electrical communication between conductive element 80 and source well 75. A first contact element 85 establishes communication between conductive element 32 (depicted as overlying voltage shunting element 70) and the drain well 76 of transistor 72, while a second contact element 87 establishes communication between $V_{SS}$ and conductive link 84 and, thus, with both conductive element 80 and the source well 75 of transistor 72.

In transistor 73, which communicates with $V_{SS}$, conductive link 84 extends between and electrically contacts conductive element 80 and the drain well 76. First and second contact elements 86 and 88, respectively, electrically communicate with different portions of transistor 73. First contact element 86 establishes electrical communication between the source well 75 of transistor 73 and $V_{DD}$. Second contact element 88 electrically connects an associated conductive element 32 (depicted as overlying voltage shunting element 70) with conductive link 84 of transistor 73 and, thus, with the conductive element 80 and the drain well 76, with which conductive link 84 communicates.

Known fabrication processes may be used to form the various features of transistors 72 and 73, as well as the underlying insulative layer 71, overlying insulative layer 90, and contact elements 85-88.

Figure 9:
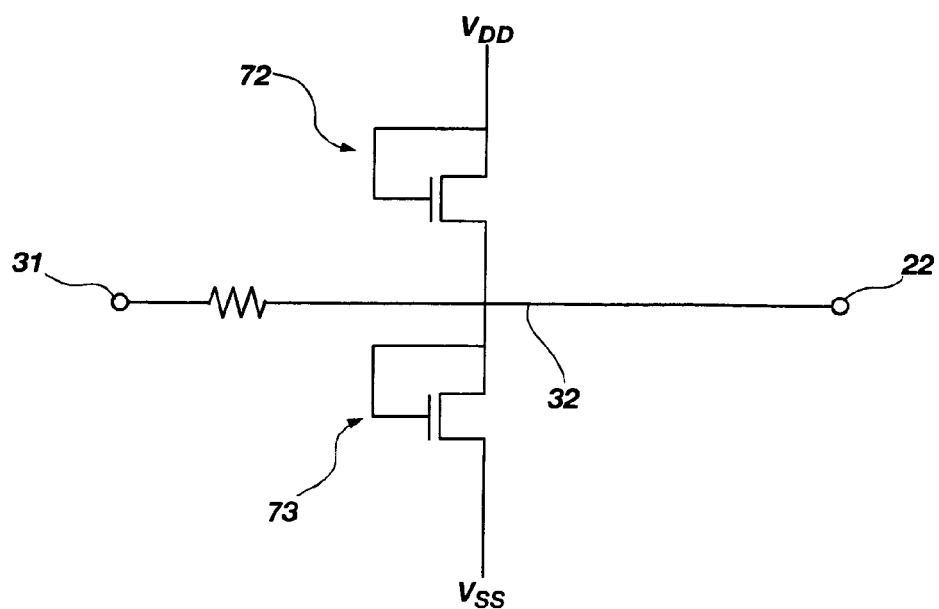
FIG. 9 is a combined block diagram/enlarged schematic representation of an interconnect circuit including the voltage shunting element of FIG. 8.

An electrical schematic representation of a voltage shunting element 70 of the type shown in FIG. 8 is provided in FIG. 9.

Figure 10:
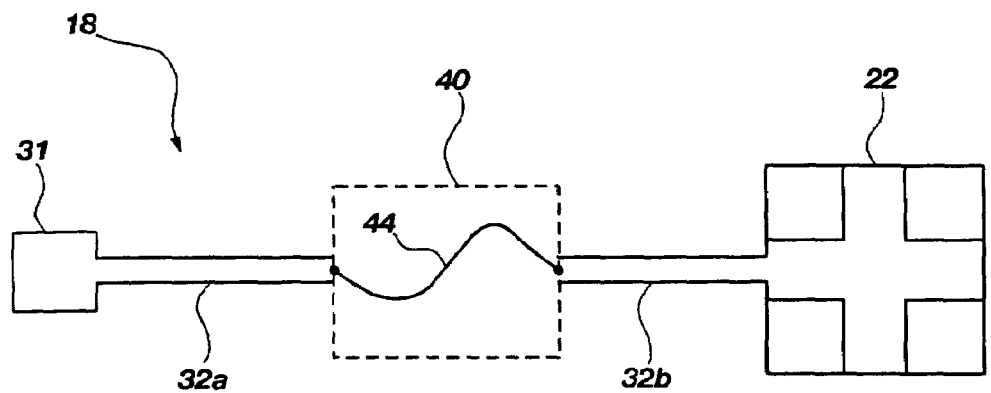
FIG. 10 is a combined block diagram/enlarged schematic representation of the interconnect circuit of FIG. 2 illustrating another example of an ESD structure, which comprises a fusible element.

FIG. 10 depicts a combined block diagram/enlarged schematic representation of another insert 18 of FIG. 2, illustrating ESD structure 40 as comprising a fusible element 44. Fusible element 44 is configured to electrically connect to contact pad 31 through conductive element 32a. Similarly, fusible element 44 is configured to electrically connect to the contact tip 22 through conductive element 32b.

Figure 11:
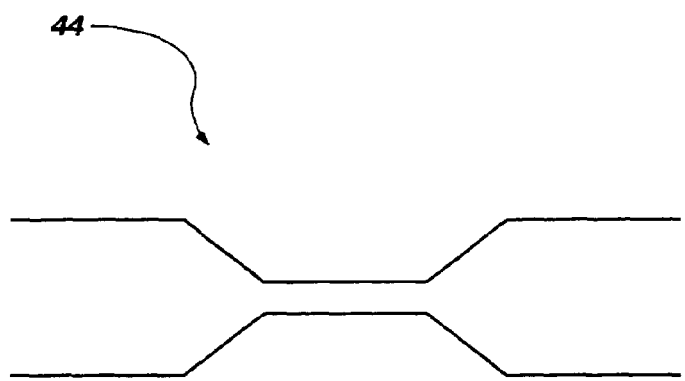
FIG. 11 is a top plan layout of the fusible element of FIG. 10.

FIG. 11 is a top plan layout of fusible element 44 of FIG. 10, as implemented on a silicon substrate 12 (not shown). Fusible element 44 may be implemented using metal, a metal alloy, polysilicon or other conducting material and may be fabricated by known processes. Fusible element 44 is shaped so as to fuse during an ESD event. If fusible element 44 fuses, or is "blown," during an ESD event, the fused or "blown" fusible element 44 may provide a visual indicator of the ESD event, which may be useful for determining where the ESD event occurred or even why the ESD event occurred.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for protecting a separate semiconductor device from at least one electrostatic discharge event during testing of the separate semiconductor device, the method comprising:

electrically connecting testing circuitry to an insert of configured to establish electrical communication with the separate semiconductor device, the insert consisting of:
a bulk semiconductor substrate comprising a full or partial wafer;
contact structures carried by the bulk semiconductor substrate;
at least one conductor carried by the bulk semiconductor substrate and in communication with a pair of the contact structures; and
at least one electrostatic discharge structure in communication with the at least one conductor, the at least one electrostatic discharge structure including:
a first resistive element located between a contact pad of the insert and a node; and
a second resistive element located between the node and at least one test contact of the insert;
assembling the separate semiconductor device in superimposed relation over the insert with at least one bond pad of the separate semiconductor device aligned with a corresponding contact structure of the insert and electrically connecting the at least one bond pad of the separate semiconductor device to the corresponding contact structure of the insert;
applying at least one test signal through the insert, including through an electrostatic discharge structure carried by the insert, to the separate semiconductor device; and
shunting at least one electrostatic discharge event:
through the first resistive element, which limits a peak current; and
from the first resistive element into a first diode that communicates with a $V_{DD}$ voltage if a magnitude of a voltage of the at least one electrostatic discharge event exceeds a predetermined maximum positive voltage threshold or into a second diode that communicates with a $V_{SS}$ voltage if a magnitude of the at least one electrostatic discharge event exceeds a predetermined maximum negative voltage threshold; and
conveying current within a range defined by the predetermined maximum positive voltage threshold and the predetermined maximum negative voltage threshold through the first resistive element, to the second resistive element, and through the second resistive element for application to a circuit of the separate semiconductor device.

2. The method of claim 1, wherein electrically connecting the separate semiconductor device comprises placing the at least one bond pad of the separate semiconductor device against the corresponding contact structure of the insert, with the corresponding contact structure comprising a contact tip.

3. The method of claim 2, wherein, during placing of the at least one bond pad of the separate semiconductor device against the contact tip of the insert, a configuration of at least one of the at least one bond pad and the contact tip facilitates self-alignment of the at least one bond pad with the contact tip.

4. The method of claim 2, wherein placing the at least one bond pad of the separate semiconductor device against the contact tip of the insert includes self-alignment of the separate semiconductor device with the insert.

5. The method of claim 1, wherein electrically connecting the separate semiconductor device comprises placing a plurality of semiconductor devices adjacent to the insert.

6. The method of claim 1, wherein shunting the at least one electrostatic discharge event includes shunting the excess voltage through the first diode if a voltage of the at least one electrostatic discharge event is at least 0.7 V more than the $V_{DD}$ voltage.

7. The method of claim 1, wherein shunting the at least one electrostatic discharge event includes shunting the excess voltage through the second resistor resistive element and into the second diode if a voltage of the at least one electrostatic discharge event is at least 0.7 V less than the $V_{SS}$ voltage.

* * * * *

UNITED STATES PATENT AND TRADEMARK OFFICE
CERTIFICATE OF CORRECTION

| | | |
|---|---|---|
| PATENT NO. | : 7,709,279 B2 | Page 1 of 1 |
| APPLICATION NO. | : 10/827806 | |
| DATED | : May 4, 2010 | |
| INVENTOR(S) | : David R. Hembree et al. | |

It is certified that error appears in the above-identified patent and that said Letters Patent is hereby corrected as shown below:

On the face page, in field (54), in "Title", in column 1, line 2, delete "DEVICES" and insert -- DEVICES, --, therefor.

In column 1, line 2, delete "DEVICES" and insert -- DEVICES, --, therefor.

In column 8, line 21, in Claim 1, after "insert" delete "of".

In column 10, line 13, in Claim 7, delete "$V_{ss}$voltage." and insert -- $V_{ss}$ voltage. --, therefor.

Signed and Sealed this

Twentieth Day of July, 2010

David J. Kappos
*Director of the United States Patent and Trademark Office*